(12) United States Patent
Murofushi et al.

(10) Patent No.: US 7,560,737 B2
(45) Date of Patent: Jul. 14, 2009

(54) SEMICONDUCTOR LIGHT EMITTING ELEMENT AND FABRICATION METHOD THEREOF

(75) Inventors: Hitoshi Murofushi, Niiza (JP); Shiro Takeda, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 49 days.

(21) Appl. No.: 11/231,071

(22) Filed: Sep. 20, 2005

(65) Prior Publication Data

US 2006/0076565 A1    Apr. 13, 2006

(30) Foreign Application Priority Data

Sep. 29, 2004    (JP)    .............................. 2004-284924

(51) Int. Cl.
*H01L 27/15*    (2006.01)
*H01L 29/26*    (2006.01)
*H01L 31/12*    (2006.01)
*H01L 33/00*    (2006.01)

(52) U.S. Cl. ...................................................... 257/79
(58) Field of Classification Search .................... 257/79
See application file for complete search history.

(56) References Cited

U.S. PATENT DOCUMENTS

| | | | | |
|---|---|---|---|---|
| 5,233,204 A | | 8/1993 | Fletcher et al. | |
| 5,571,339 A | * | 11/1996 | Ringel et al. | 136/252 |
| 5,881,089 A | * | 3/1999 | Berggren et al. | 372/96 |
| 6,287,882 B1 | * | 9/2001 | Chang et al. | 438/29 |
| 6,495,862 B1 | | 12/2002 | Okazaki et al. | |
| 6,683,898 B2 | * | 1/2004 | Østergaard et al. | 372/43.01 |
| 6,744,071 B2 | | 6/2004 | Sano et al. | |
| 6,835,956 B1 | * | 12/2004 | Nagahama et al. | 257/79 |
| 6,990,259 B2 | * | 1/2006 | Cunningham | 385/12 |
| 2003/0183825 A1 | * | 10/2003 | Morse | 257/79 |
| 2004/0170356 A1 | * | 9/2004 | Iazikov et al. | 385/37 |
| 2005/0205883 A1 | * | 9/2005 | Wierer et al. | 257/98 |
| 2006/0027815 A1 | * | 2/2006 | Wierer et al. | 257/79 |

FOREIGN PATENT DOCUMENTS

| | | |
|---|---|---|
| JP | 10-163525 | 6/1998 |
| JP | 11-046005 | 2/1999 |
| JP | 2003-078167 | 3/2003 |
| JP | 2004/186268 | 7/2004 |

* cited by examiner

*Primary Examiner*—Kenneth A Parker
*Assistant Examiner*—Anthony Ho
(74) *Attorney, Agent, or Firm*—Howard & Howard Attorneys PLLC

(57) ABSTRACT

In a semiconductor light emitting element, multiple bosses having a cylindrical shape and dispersed like islands, and recesses are formed on the upper surface of a window layer. A contact electrode is formed on the upper surface of the bosses. A transparent dielectric film is formed in the recesses. A transparent conductor film is formed on the transparent dielectric film and the contact electrode.

9 Claims, 6 Drawing Sheets

SEMICONDUCTOR LIGHT EMITTING ELEMENT AND FABRICATION METHOD THEREOF

BACKGROUND OF THE INVENTION

1. Field of the Invention

The present invention relates to a semiconductor light emitting element such as a light emitting diode, a semiconductor laser, etc. and a fabrication method thereof.

2. Description of the Related Art

To improve the luminance of a semiconductor light emitting element such as a light emitting diode, a semiconductor laser, etc., it is extremely important to efficiently extract the light emitted by the active layer of the light emitting element to the outside of the element. That is, it is necessary to restrict light reflection on the surface of the light emitting element as much as possible to let out the emitted light to the outside of the element and increase the so-called light extraction efficiency.

As a means for restricting light reflection on the surface of the light emitting element and increasing the light extraction efficiency, there is a method for restricting total reflection on the surface of the light emitting element. The ratio between the light emitted through the element surface and the light total-reflected on the element surface is determined by the refraction index of the surface layer of the element and the refraction index of the outside world (including a transparent protection layer or the like). As the difference in the refraction index between the surface layer and the outside world is smaller, the critical angle is larger. The critical angle is an angle of light incidence to the interface between the surface layer and the outside world. Assume that the refraction index of the surface layer is $n_{11}$ and the refraction index of the outside world is $n_{12}$. In this case, the critical angle $\theta$ is expressed by the following mathematical expression 1.

$$=\sin^{-1}(n_{11}/n_{12}) \quad \text{(Mathematical Expression 1)}$$

As obvious from the mathematical expression 1, as the difference between the refraction index $n_{11}$ of the surface layer and the refraction index $n_{12}$ of the outside world is smaller, that is, as the ratio $n_{11}/n_{12}$ is closer to 1, the critical angle $\theta$ takes a larger value (a value closer to 90°). Light having a larger angle of incidence than the critical angle $\theta$ is total-reflected on the interface and thus is not let out to the outside. Accordingly, as the difference between the refraction indexes is smaller, the ratio of the light to be total-reflected is smaller, so that more light is emitted to the outside world resulting in achieving a higher light extraction efficiency.

However, a general light emitting element is formed of a surface layer made of gallium arsenide or the like having a refraction index of 2 to 4, which is molded with resin having a refraction index of about 1.5. Since the difference in the refraction index between the surface layer and the outside world is relatively large, the light extraction efficiency is relatively low. Therefore, various methods for improving the light extraction efficiency have been developed.

As one of such methods, there is a technique for forming a light scattering layer having recesses and bosses on its surface, on the optical window from which light is extracted, as disclosed in Unexamined Japanese Patent Application KOKAI Publication No. H10-163525 and Unexamined Japanese Patent Application KOKAI Publication No. H11-46005. By forming the light scattering layer having recesses and bosses on its surface, it is expected that total-reflection of the light on the surface of the light scattering layer be restricted and the light be efficiently emitted to the outside of the element. Furthermore, there is a technique for forming a thick window layer on the upper surface of the light emitting layer, as disclosed in U.S. Pat. No. 5,233,204.

However, the formation of such a scattering layer and window layer has problems in the viewpoints of workability, repeatability, etc. For example, according to the light scattering layer forming method disclosed in Unexamined Japanese Patent Application KOKAI Publication No. H10-163525, scattering particles need to be uniformly dispersed. According to the light scattering layer forming method disclosed in Unexamined Japanese Patent Application KOKAI Publication No. H11-46005, air bubbles need to be uniformly dispersed in a liquid-like film. However, it is extremely difficult to carry out the dispersion with a good repeatability and fabricate light emitting elements having a high uniformity and a desired luminance at a high yield. Moreover, if the window layer disclosed in U.S. Pat. No. 5,233,204 is grown thick by an epitaxial method, the crystal might be deteriorated.

SUMMARY OF THE INVENTION

The present invention was made in view of the above-described circumstance, and it is an object of the present invention to provide a semiconductor light emitting element which can improve the light extraction efficiency, and a fabrication method thereof.

Another object of the present invention is to provide a semiconductor light emitting element which can suitably restrict reflection of emitted light on the element surface, and a fabrication method thereof.

To achieve the above objects, a semiconductor light emitting element according to a first aspect of the present invention comprises:

a semiconductor layer whose one surface comprises an optical window, on which a plurality of bosses and recesses are formed;

a dielectric film having light transmissivity and formed in the recesses; and a conductor film having light transmissivity and formed on the one surface of the semiconductor layer, wherein the conductor film and the semiconductor layer are electrically connected to each other.

It is preferred that the conductor film and the semiconductor layer be electrically connected to each other via the bosses.

It is preferred that the bosses and the recesses be formed on the semiconductor layer so that a current which is to flow from the conductor film into the semiconductor layer will flow into the whole surface of the one surface.

It is preferred that the semiconductor light emitting element further comprise a conductive film having a light transmissivity and formed on the bosses, and the conductor film and the bosses be electrically connected to each other via the conductive film.

It is preferred that a refraction index n1 of the conductor film, a refraction index n2 of the dielectric film, and a refraction index n3 of the semiconductor layer satisfy a relationship of $n1 \leq n2 < n3$.

It is preferred that a width X of the bosses and a height Y of the bosses satisfy a relationship of $(Y/3) \leq X \leq 3Y$.

It is preferred that a wavelength λ of a light emitted in the semiconductor layer and a width X of the bosses satisfy a relationship of $X \geq (\lambda/2)$, and the wavelength λ of the light emitted in the semiconductor layer and a height Y of the bosses satisfy a relationship of $Y \geq (\lambda/2)$.

It is preferred that the semiconductor light emitting element further comprise a protection film which is formed on the conductor film.

It is preferred that a refraction index n1 of the conductor film, a refraction index n2 of the dielectric film, a refraction index n3 of the semiconductor layer and a refraction index n4 of the protection film satisfy relationships of $n4 < n1 \leq n2 < n3$.

To achieve the above objects, a fabrication method of a semiconductor light emitting element according to a second aspect of the present invention comprises a step of forming a plurality of bosses and recesses on one surface of a semiconductor layer that comprises an optical window, forming a dielectric film having light transmissivity in the recesses, and forming a conductor film having light transmissivity on the one surface of the semiconductor layer, wherein in this step, the conductor film, the dielectric film, and the semiconductor layer are formed so that the conductor film and the semiconductor layer will be electrically connected to each other via the bosses.

It is preferred that the bosses and the recesses are formed so that a current which is to flow from the conductor film into the semiconductor layer will flow into the whole surface of the one surface.

It is preferred that the fabrication method further comprise a step of forming a conductive film having light transmissivity on the bosses, wherein in this step, the conductive film is formed so that the conductor film and the bosses will be electrically connected to each other via the conductive film.

It is preferred that the conductor film, the dielectric film, and the semiconductor layer be formed by using materials which allow a refraction index n1 of the conductor film, a refraction index n2 of the dielectric film, and a refraction index n3 of the semiconductor layer to satisfy a relationship of $n1 \leq n2 < n3$.

It is preferred that the bosses be formed so that a width X of the bosses and a height Y of the bosses will satisfy a relationship of $(Y/3) \leq X \leq 3Y$.

It is preferred that the bosses be formed so that a wavelength λ of a light emitted in the semiconductor layer and a width X of the bosses will satisfy a relationship of $X \geq (\lambda/2)$, and the wavelength λ of the light emitted in the semiconductor layer and a height Y of the bosses will satisfy a relationship of $Y \geq (\lambda/2)$.

It is preferred that the fabrication method further comprise a step of forming a protection film on the conductor film.

It is preferred that the conductor film, the dielectric film, the semiconductor layer, and the protection film be formed by using materials which allow a refraction index n1 of the conductor film, a refraction index n2 of the dielectric film, a refraction index n3 of the semiconductor layer, and a refraction index n4 of the protection film to satisfy relationships of $n4 < n1 \leq n2 < n3$.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A semiconductor light emitting element and fabrication method thereof according to an embodiment of the present invention will now be explained with reference to the drawings, by illustrating a case where a light emitting diode is used as the light emitting element.

Figure 1:
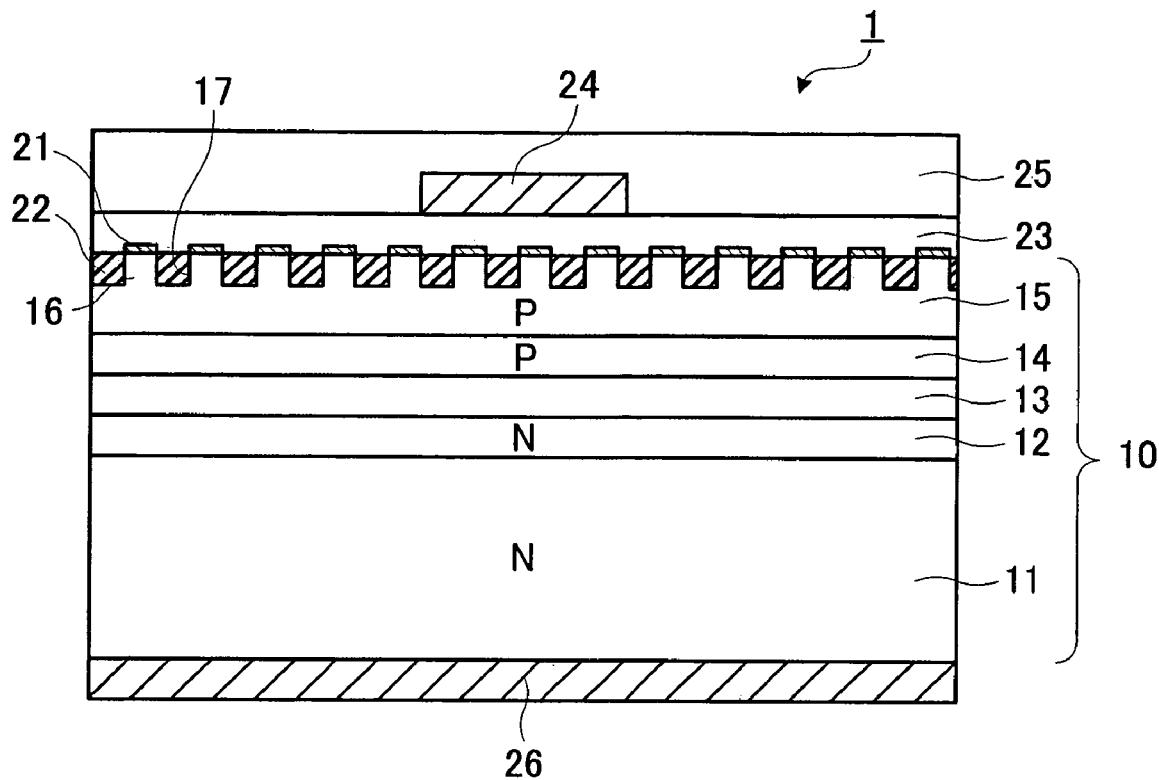
FIG. 1 is a diagram showing the configuration of a semiconductor light emitting element according to an embodiment of the present invention.

As shown in FIG. 1, a semiconductor light emitting element 1 according to the present embodiment comprises a semiconductor base 10, a contact electrode 21, a transparent dielectric film 22, a transparent conductor film 23, an anode electrode 24, a protection layer 25, and a cathode electrode 26. The semiconductor base 10 includes an N-type substrate 11, an N-type auxiliary layer 12, an active layer 13, a P-type auxiliary layer 14, and a window layer 15.

The N-type substrate 11 is formed of an N-type semiconductor substrate made of silicon (Si), gallium-arsenide (GaAs), gallium-phosphorus (GaP), silicon carbide (SiC), or the like. The N-type substrate 11 is formed with, for example, an impurity concentration of about $1 \times 10^{18}$ cm$^{-3}$, and a thickness of about 250 μm.

The N-type auxiliary layer 12 is formed on the N-type substrate 11, and is formed of a semiconductor layer made of aluminum-gallium-indium-phosphorus (AlGaInP), aluminum-indium-phosphorus (AlInP), or the like. The N-type auxiliary layer 12 is formed by, for example, epitaxial growth method. The N-type auxiliary layer 12 is formed with, for example, an impurity concentration of about $5 \times 10^{17}$ cm$^{-3}$, and a thickness of about 2 μm.

The active layer 13 is formed on the N-type auxiliary layer 12, and is formed of a semiconductor layer made of AlGaInP, AlInP, or the like. The active layer 13 is formed by, for example, an epitaxial growth method. The active layer 13 is formed with, for example, a thickness of about 0.5 μm. The active layer 13 is a light emitting layer which emits light by electroluminescence. The active layer 13 causes light emission when carriers (holes and electrons) injected thereinto from both surfaces thereof are recombined.

The P-type auxiliary layer 14 is formed on the active layer 13, and is formed of a semiconductor layer made of AlGaInP, AlInP, or the like. The P-type auxiliary layer 14 is formed by, for example epitaxial growth method. The P-type auxiliary layer 14 is formed with, for example, an impurity concentration of about $5 \times 10^{17}$ cm$^{-3}$, and a thickness of about 2 µm.

The relative proportion of Al in AlGaInP that makes up the N-type auxiliary layer 12 or the P-type auxiliary layer 14 is set higher than the relative proportion of Al in AlGaInP that makes up the active layer 13. By this setting, it is possible to efficiently emit light generated by carrier recombination that takes place in the active layer 13 to the outside of the active layer 13.

The N-type auxiliary layer 12 and the P-type auxiliary layer 14 may be called N-type cladding layer and P-type cladding layer respectively.

The window layer 15 is formed on the P-type auxiliary layer 14, and is formed of a semiconductor layer made of GaP doped with a P-type impurity, AlGaInP, aluminum-gallium-arsenide (AlGaAs), or the like. The window layer 15 is also called current diffusion layer. The window layer 15 is formed by, for example, epitaxial growth method. The window layer 15 is formed, for example, with an impurity concentration of about $5 \times 10^{17}$ cm$^{-3}$ and a thickness of about 2 µm. A current block layer made of N-type AlGaInP or the like may be provided between the P-type auxiliary layer 14 and the window layer 15.

Figure 2:
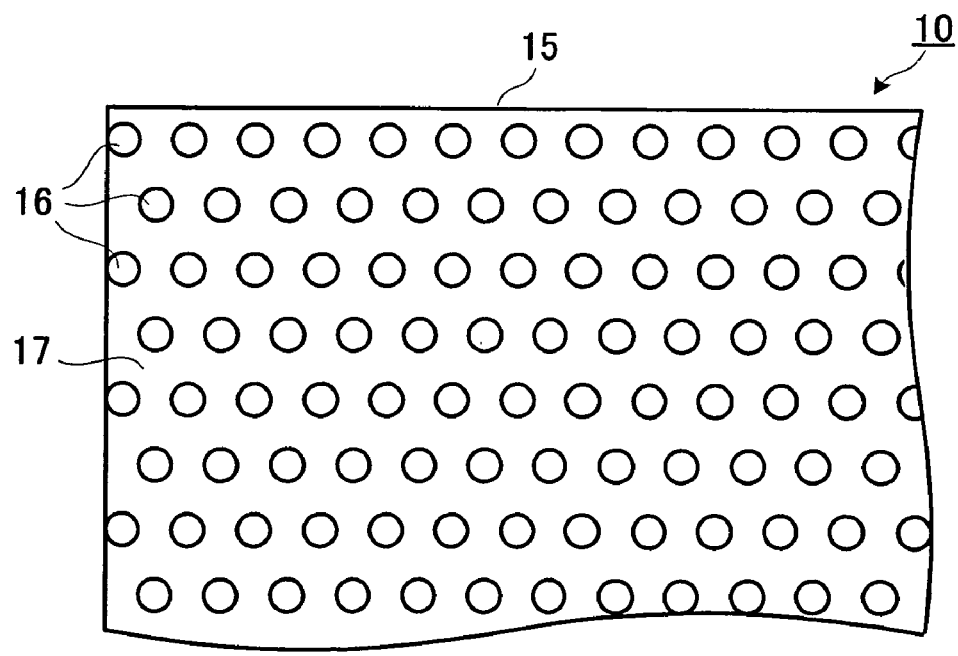
FIG. 2 is a plan view diagram of a window layer.

The upper surface of the window layer 15 forms one surface of the semiconductor base 10, and has an optical window of the semiconductor base 10 from which light emitted by the active layer 13 is extracted. FIG. 2 shows the plan view of the window layer 15 (semiconductor base 10). As shown in FIG. 1 and FIG. 2, multiple bosses 16 having a cylindrical shape which are dispersed like islands are formed on the upper surface of the window layer 15. Therefore, the portions that are relatively recessed as compared with the bosses 16 constitute recesses 17. As a result, multiple bosses 16 and recesses 17 are formed on the upper surface of the window layer 15. According to the present embodiment, the bosses 16 and recesses 17 are formed on the upper surface of the window layer 15 in a staggered state.

Figure 3:
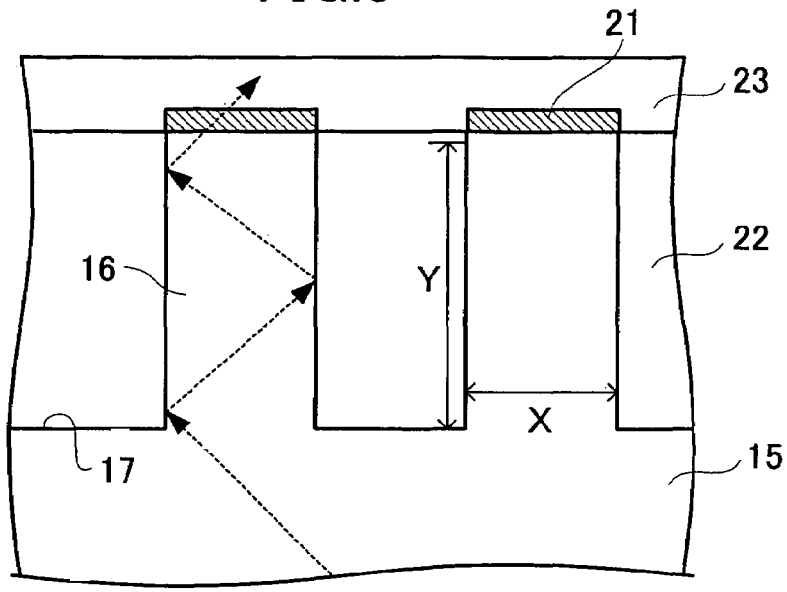
FIG. 3 is a diagram showing bosses and recesses.

As shown in FIG. 3, it is preferable that the width X of the boss 16 and the height Y of the boss 16 satisfy the following mathematical expression 2, and it is more preferable that the width X and height Y satisfy the following mathematical expression 3.

i. $(Y/3) \leq X \leq 3Y$ (Mathematical Expression 2)

i. $(Y/2) \leq X \leq 2Y$ (Mathematical Expression 3)

This is because, if it is (Y/3)>X, the light which is included in the light emitted by the active layer 13 and which is irradiated on the interface between the side surface of the boss 16 and the transparent dielectric film 22 might degenerate while being repeatedly total-reflected on this interface. This is also because, if it is X>3Y, the amount of light which arrives at the interface between the side surface of the boss 16 and the transparent dielectric film 22 to be let out to the outside through the transparent dielectric film 22 might be reduced.

Furthermore, if the width X and height Y of the boss 16, in other words, the width and depth of the recess 17 become too minute, the influence of diffraction on the embossed and recessed surface becomes great and the light extraction efficiency might be lowered. In order to reduce the influence of diffraction, it is preferable that the wavelength λ of the light emitted by the active layer 13, and X and Y satisfy the following mathematical expression 4 and mathematical expression 5.

i. $X \geq (\lambda/2)$ (Mathematical Expression 4)

i. $Y \geq (\lambda/2)$ (Mathematical Expression 5)

The contact electrode 21 is formed on the upper surface of the bosses 16 of the window layer 15. The contact electrode 21 is formed of a very thin metal layer having a thickness of, preferably, 1 to 10 nm, or more preferably, 1 to 5 nm, in order to have light transmissivity. Thus, the contact electrode 21 can allow the light emitted from the active layer 13 to transmit therethrough to be let out to the outside of the element. The contact electrode 21 is made of one metal selected from gold (Au), nickel (Ni), germanium (Ge), beryllium (Be), titanium (Ti), chromium (Cr), Si, Al, and zinc, (Zn), or metal alloy of these metals. The contact electrode 21 may be made of a metal other than the above-listed metal materials. However, it is preferable to use the above-listed metals because the contact electrode 21 made of the above-listed metals would have an excellent low-resistive contact with the window layer 15 made of AlGaInP or the like.

The transparent dielectric film 22 is formed so as to fill up the recesses 17 of the window layer 15. The transparent dielectric film 22 is formed of a dielectric film having light transmissivity. Therefore, the transparent dielectric film 22 can allow the light emitted from the active layer 13 to transmit therethrough to be let out to the outside of the element. The transparent dielectric film 22 does not have low-resistive contact with the window layer 15 and with the transparent conductor film 23. The transparent dielectric film 22 is made of, for example, titanium oxide (TiO), zinc oxide (ZnO), zirconium oxide (ZrO), silicon oxide (SiO), or the like.

The transparent conductor film 23 is formed on the transparent dielectric film 22 and the contact electrode 21. The transparent conductor film 23 is formed of a conductor film having light transmissivity. Therefore, the transparent dielectric film 22 can allow the light emitted from the active layer 13 to transmit therethrough to be let out to the outside of the element. The transparent conductor film 23 is made of, for example, indium tin oxide (ITO), indium oxide (InO), tin oxide (SnO), or the like. The transparent conductor film 23 has an excellent low-resistive contact with the anode electrode 24 formed thereon and with the contact electrode 21, but does not have low-resistive contact with the transparent dielectric film 22.

The anode electrode 24 is formed on the upper surface of the transparent conductor film 23, and is formed at the center of the transparent conductor film 23 so as to have generally a circular shape as the semiconductor light emitting element 1 is seen from above (in plan-view perspective). The anode electrode 24 has its circumference surrounded annularly by the protection layer 25. The anode electrode 24 is made of a metal that has an excellent low-resistive contact with the transparent conductor film 23, and is formed of, for example, an Au electrode, a stacked electrode of Au and Ti, a stacked electrode of Au and Cr, or a stacked electrode of Au and Ni.

The protection layer 25 is formed on the upper surface of the transparent conductor film 23 and anode electrode 24. The protection layer 25 is made of a material having a high light transmissivity such as epoxy resin or the like, and has a function of protecting the semiconductor base 10 from moisture, etc.

The cathode electrode 26 is formed on the lower surface of the N-type substrate 11 (semiconductor base 10). The cathode electrode 26 is made of a metal having low-resistive contact with the N-type substrate 11, and is formed of, for example, an Au electrode, a stacked electrode of Au and Ti, a stacked electrode of Au and Cr, a stacked electrode of Au and Ni, a stacked electrode of Au, Ni, and Ti, an AuGeNi metal alloy electrode, an AuGe metal alloy electrode, or an AuSi metal alloy electrode.

Figure 4:
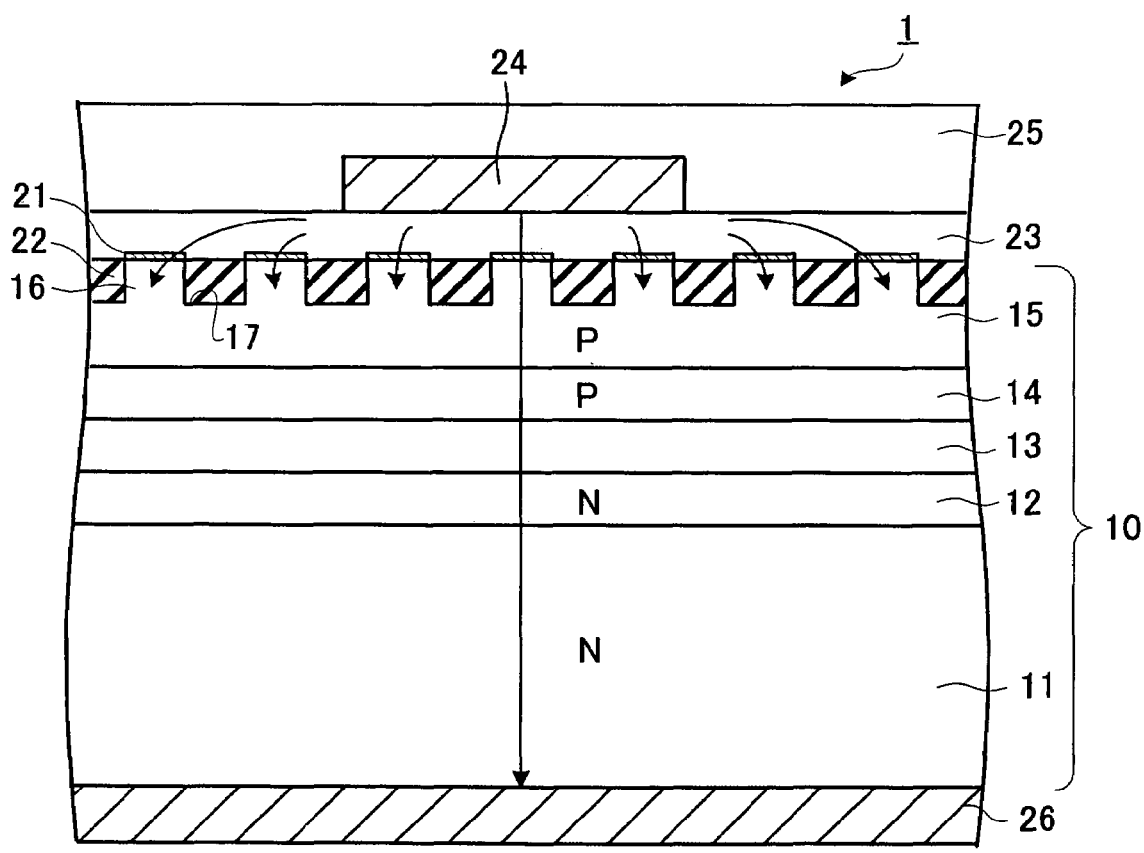
FIG. 4 is a diagram for explaining the current flow in the semiconductor light emitting element.

In the semiconductor light emitting element 1 having the above-described configuration, when a voltage is applied between the anode electrode 24 and the cathode electrode 26 in a manner that the potential at the anode electrode 24 will be higher, a current flows from the anode electrode 24 towards the cathode electrode 26 through the transparent conductor film 23, the contact electrode 21, the bosses 16, the window layer 15, the P-type auxiliary layer 14, the active layer 13, the N-type auxiliary layer 12, and the N-type substrate 11, as shown in FIG. 4. The bosses 16 and the recesses 17 are formed on the upper surface of the window layer 15, the contact electrode 21 is formed on the upper surface of the bosses 16, and the transparent dielectric film 22 is formed in the recesses 17. The transparent conductor film 23 has an excellent low-resistive contact with the anode electrode 24 and the contact electrode 21, but does not have low-resistive contact with the transparent dielectric film 22. Because of this, as shown in FIG. 4, the current flowing from the anode electrode 24 to the transparent conductor film 23 goes in the transversal direction of the transparent conductor film 23 (the leftward and rightward direction of FIG. 4) to dividedly flow into the multiple bosses 16 of the window layer 15 via the contact electrode 21. As a result, the current well flows into even the element's outermost portion in the active layer 13. Accordingly, the light emitted from the active layer 13 can be excellently let out, improving the light extraction efficiency.

It is preferable that the bosses 16 and recesses 17 be formed to enable the current from the anode electrode 24 to flow through the entire upper surface of the active layer 13. Therefore, it is preferred that the bosses 16 be formed over the entire upper surface of the window layer 15, so that the current from the anode electrode 24 will flow through the entire upper surface of the window layer 15.

The current flowing from the anode electrode 24 into the transparent conductor film 23 does not flow into the window layer 15 via the transparent dielectric film 22. Therefore, the currents that are to flow into the active layer 13 via the window layer 15 and P-type auxiliary layer 14 are relatively large under the bosses 16 while being relatively small under the recesses 17. As a result, the amounts of light emitted from the active layer 13 are relatively large under the bosses 16, while relatively small under the recesses 17.

Figure 5:
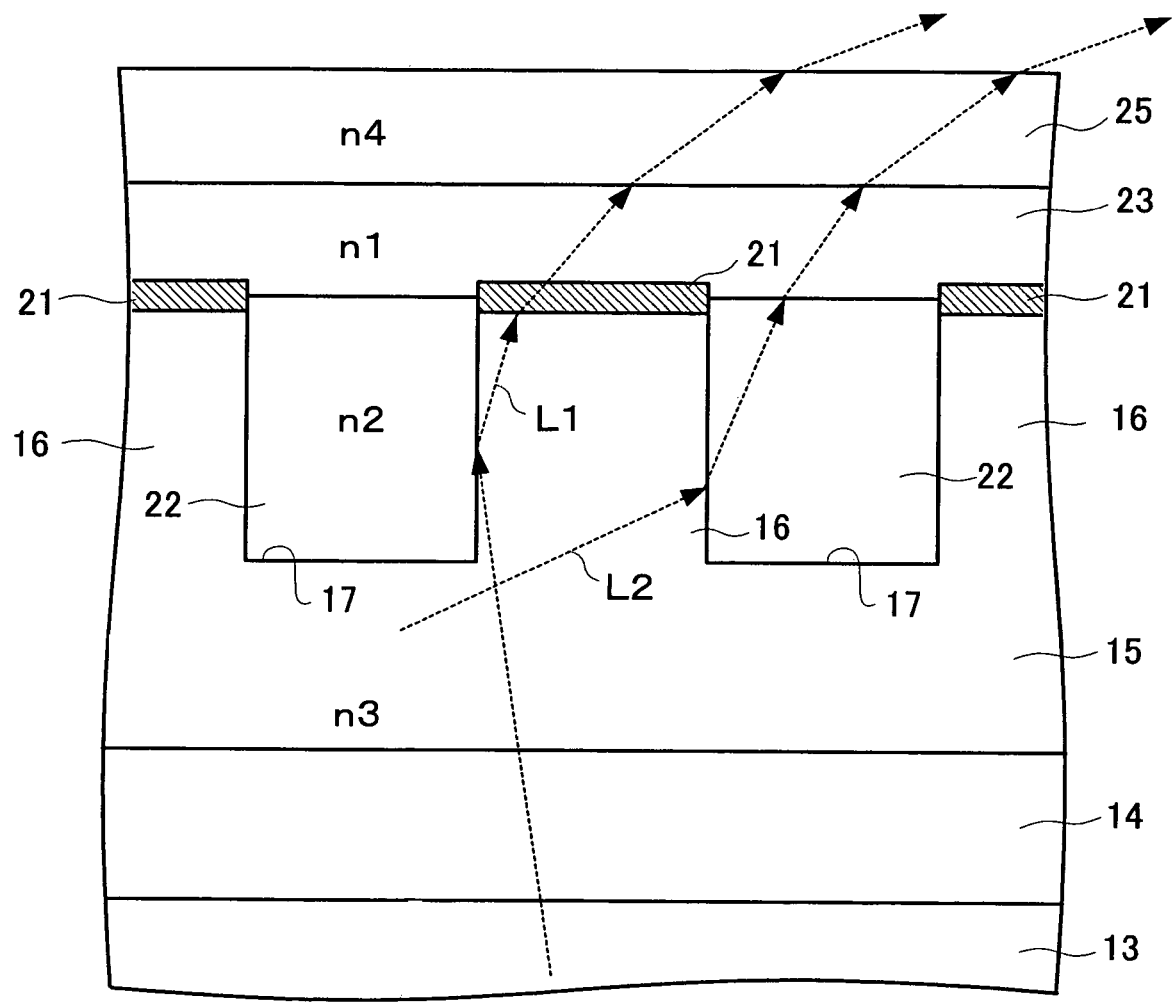
FIG. 5 is a diagram for explaining the light refraction on the bosses and recesses.

As shown in FIG. 5, a part L1 of the light emitted under the boss 16 is reflected on the interface between the side surface of the boss 16 and the transparent dielectric film 22 and excellently let out to the outside of the element via the contact electrode 21, the transparent conductor film 23, and the protection film 25. Further, as shown in FIG. 5, a part of the light emitted under the boss 16 or the light L2 emitted under the recess 17 enters the interface between the side surface of the boss 16 and the transparent dielectric film 2, and is excellently let out to the outside of the element via the transparent dielectric film 22 and the transparent conductor film 23. Therefore, it is possible to efficiently extract the light emitted by the active layer 13 to the outside of the element, and the light extraction efficiency is improved.

As described, with the multiple bosses 16 formed on the upper surface of the window layer 15, the semiconductor light emitting element 1 of the present embodiment has such a structure in which multiple light emitting elements each having a thick window layer are gathered. Therefore, the semiconductor light emitting element 1 can have an improved light extraction efficiency as compared with a conventional light emitting element. Further, since the window layer 15 is not formed too thick, deterioration of the crystal can be suppressed. Therefore, it is possible to improve the light extraction efficiency to such a level as would be achieved by a light emitting element having a thick window layer, while it is also possible to obtain a light emitting element having an excellent crystallinity. As a result, it is possible to obtain a semiconductor light emitting element having an improved light emitting property.

In such a semiconductor light emitting element 1, it is preferred that the refraction index n1 of the transparent conductor film 23, the refraction index n2 of the transparent dielectric film 22, the refraction index n3 of the window layer 15, and the refraction index n4 of the protection layer 25 satisfy the relationship of the following mathematical expression 6.

i. $n4 < n1 \leq n2 < n3$  (Mathematical Expression 6)

The critical angle θ1 on the interface between the window layer 15 and the transparent conductor film 23 is expressed by the following mathematical expression 7.

i. $\theta 1 = \sin^{-1}(n3/n1)$  (Mathematical Expression 7)

The critical angle θ2 on the interface between the window layer 15 and the transparent dielectric film 22 is expressed by the following mathematical expression 8.

i. $\theta 2 = \sin^{-1}(n3/n2)$  (Mathematical Expression 8)

The critical angle θ3 on the interface between the transparent dielectric film 22 and the transparent conductor film 23 is expressed by the following mathematical expression 9.

i. $\theta 3 = \sin^{-1}(n2/n1)$  (Mathematical Expression 9)

The critical angle θ4 on the interface between the transparent conductor film 23 and the protection layer 25 is expressed by the following mathematical expression 10.

i. $\theta 4 = \sin^{-1}(n1/n4)$  (Mathematical Expression 10)

Therefore, by the relationship of the mathematical expression 6 being satisfied by the refraction index n1 of the transparent conductor film 23, the refraction index n2 of the transparent dielectric film 22, the refraction index n3 of the window layer 15, and the refraction index n4 of the protection layer 25, the critical angles θ1, θ2, θ3, and θ4 can be made relatively large. Accordingly, it is possible to suppress the total reflection on each interface and to improve the light extraction efficiency.

Next, the fabrication method of the semiconductor light emitting element 1 according to the present embodiment will be explained. The fabrication method described below is one example, and the present invention is not limited to this method as long as the same result can be obtained by other methods.

First, the N-type auxiliary layer 12, the active layer 13, the P-type auxiliary layer 14, and the window layer 15 are formed in this order in the stacking manner, on the N-type substrate 11 made of GaAs doped with an N-type impurity, by an epitaxial growth method. As the epitaxial growth method, metalorganic chemical vapor deposition (MOCVD), molecular beam epitaxy (MBE), chemical beam epitaxy (CBE), molecular layer epitaxy (MLE), or the like can be adopted.

For example, in case of adopting low-pressure MOCVD, the layer formation can be carried out as follows. The N-type substrate 11 made by adding an N-type impurity to GaAs is prepared, and the N-type auxiliary layer 12, the active layer 13, the P-type auxiliary layer 14, and the window layer 15 are continuously formed on the N-type substrate 11 by MOCVD.

Specifically, first, the N-type auxiliary layer 12 having the composition of, for example, $(Al_xGa_{1-y})_yIn_{1-y}P$ ($0.3 \leq x \leq 1$) is formed by using TMA (trimethylaluminum), TEG (triethylgallium), TMIn (trimethylindium), and $PH_3$ (phosphine) as material gasses. As an N-type dopant gas, for example, $SiH_4$ (monosilane), $Si_2H_6$ (disilane), DESe (diethylselenium), DETe (diethyltellurium) or the like can be used.

Next, continuously, the active layer 13 having the composition of $(Al_xGa_{1-y})_yIn_{1-y}P$ ($0.2 \leq x \leq 1$) in which the aluminum proportion is lower than that of the N-type auxiliary layer 12, is formed continuously by using the same material gasses. At this time, no dopant gas is used.

Then, continuously, the P-type auxiliary layer 14 having the composition of $(Al_xGa_{1-y})_yIn_{1-y}P$ ($0.3 \leq x \leq 1$) in which the aluminum proportion is higher than that of the active layer 13 is formed by using the same material gasses. As a manner of doping a P-type impurity, a dopant gas of, for example, DEZn (diethylzinc) or the like may be used, or a solid beryllium (Be) source may be used.

Figure 6A:
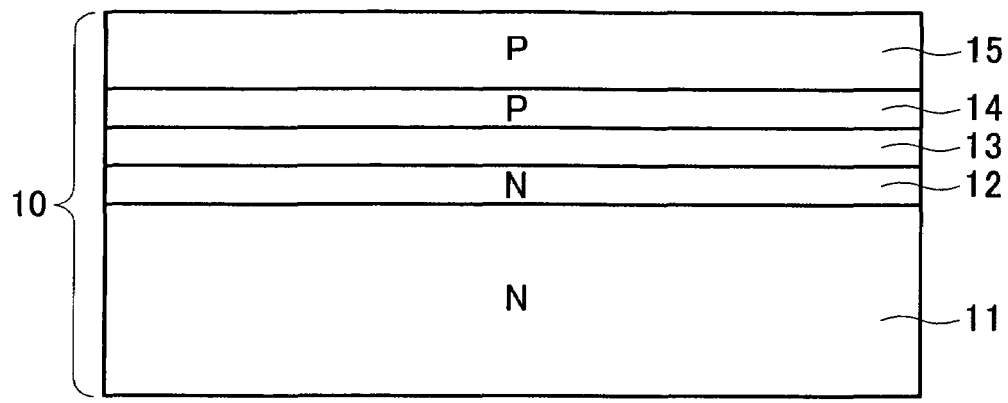
FIG. 6A to FIG. 6C are diagrams showing the fabrication process of the semiconductor light emitting element according to the embodiment.

After this, continuously, by stopping the supply of TMA and TMIn, the window layer 15 made of GaP doped with a P-type impurity is formed by introducing TEG and $PH_3$. TBP (tertiary-butylphosphine) may be used instead of $PH_3$. In this manner, the semiconductor base 10 shown in FIG. 6A is obtained.

Figure 6B:
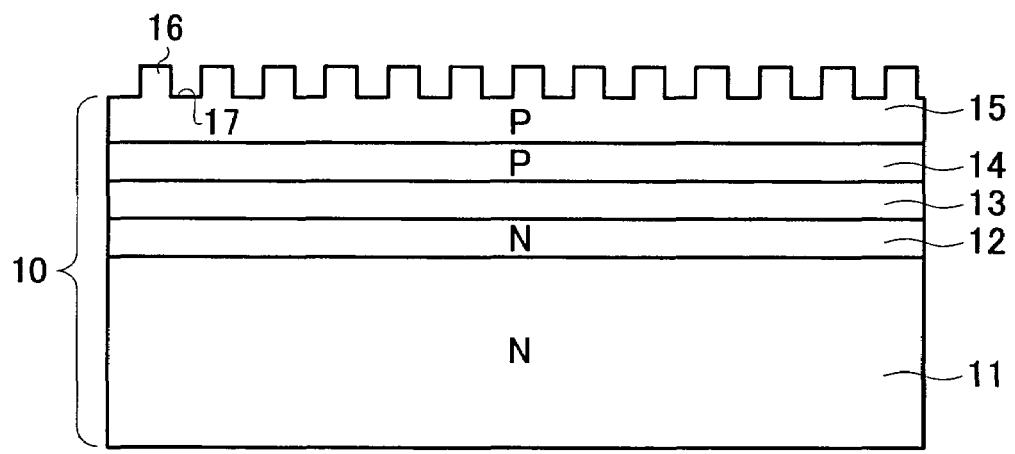
Figure 6C:
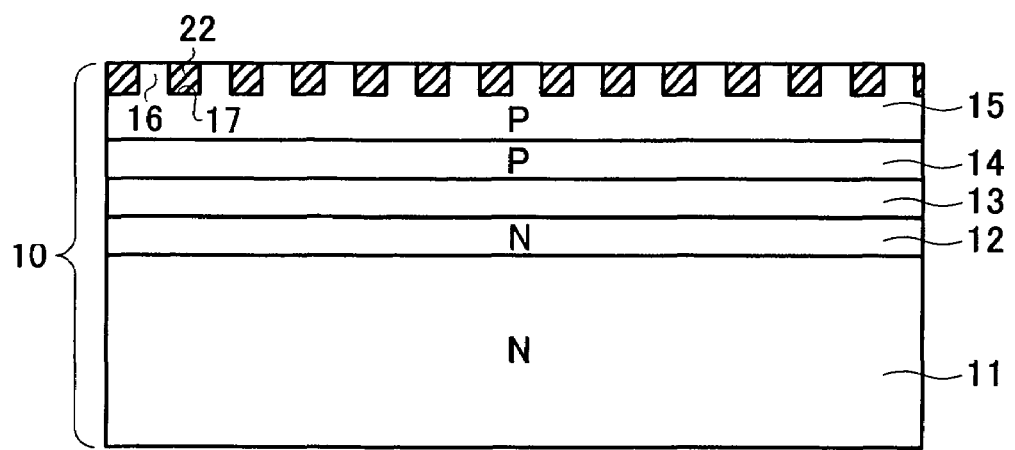

Next, predetermined regions of the upper surface of the window layer 15 are removed by, for example, etching or the like, so that multiple bosses having a cylindrical shape will be disposed on the upper surface of the window layer 15 in a staggered state. Thereby, the bosses 16 and the recesses 17 are formed on the upper surface of the window layer 15 as shown in FIG. 6B. Then, the transparent dielectric film 22 made of titanium oxide or the like is formed by a vapor deposition method, a sputtering method, a plasma CVD method, a sol-gel method, or the like, so as to fill the recesses 17 of the window layer 15 as shown in FIG. 6C.

Figure 7A:
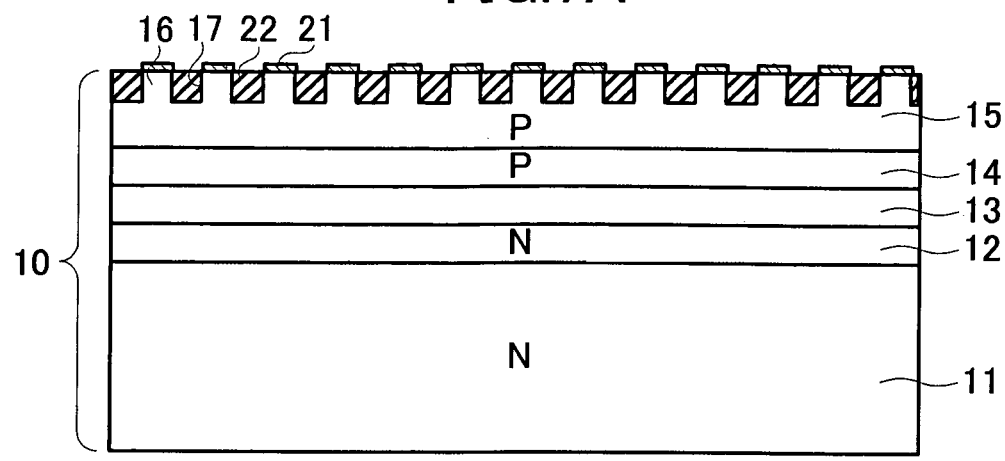
FIG. 7A to FIG. 7C are diagrams showing the fabrication process of he semiconductor light emitting element according to the embodiment.

Subsequently, a metal film or the like made of gold (Au), nickel (Ni) or the like is stacked on the window layer 15 by a vacuum vapor deposition method or a sputtering method to form a metal film. Further, the metal film existing on the transparent dielectric film 22 is removed by an etching method or the like to form the contact electrode 21 on the bosses 16 of the window layer 15 as shown in FIG. 7A.

Figure 7B:
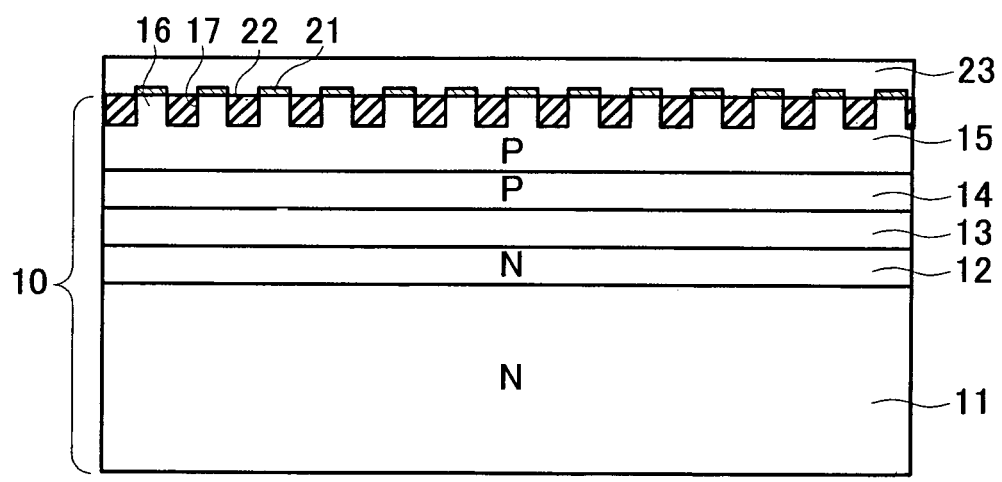

Next, the transparent conductor film 23 made of ITO, InO, or the like is formed on the window layer 15 (on the contact electrode 21 and transparent dielectric film 22) by a vapor deposition method, a sputtering method, or the like, as shown in FIG. 7B.

Figure 7C:
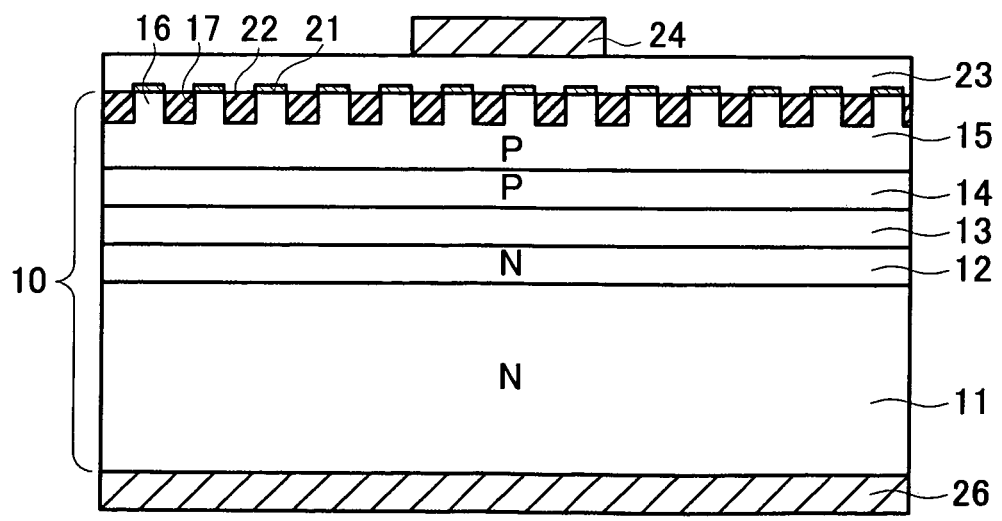

Continuously, a metal multilayered film or the like made of Au—Zn, Au—Be—Cr, and Au, or the like is stacked on the transparent conductor film 23 by a vacuum vapor deposition method, or a sputtering method, to form a metal film. Then, the anode electrode 24 is formed on the transparent conductor film 23 as shown in FIG. 7C, by removing the metal film on the transparent conductor film 23 by an etching method or the like in a manner that the anode electrode 24 will have a circular shape in plan-view perspective. Further, an Au—Ge film, or a metal multilayered film made of Au—Ge, Ni, and Au, or the like is stacked on the exposed surface of the N-type substrate 11 by a vacuum vapor deposition method or a sputtering method, to form the cathode electrode 26 as shown in FIG. 7C.

Next, the surface and the like of the transparent conductor film 23 and anode electrode 24 of the thusly obtained stacked element, are covered with protection layer 25 made of epoxy resin or the like. In this way, the semiconductor light emitting element 1 shown in FIG. 1 is obtained.

As explained above, according to the present embodiment, the bosses 16 and the recesses 17 are formed on the upper surface of the window layer 15, the contact electrode 21 is formed on the upper surface of the bosses 16, and the transparent dielectric film 22 is formed in the recesses 17. Therefore, a current flows well also into the element's outermost portion in the active layer 13, and the light emitted by the active layer 13 can excellently be let out, contributing to improving the light extraction efficiency.

According to the present embodiment, an element structure in which multiple light emitting elements each having a thick window layer are gathered is formed by forming the multiple bosses 16 on the upper surface of the window layer 15. Because of this, the light extraction efficiency of the element can be improved as compared with a conventional light emitting element, and at the same time, a light emitting element having an excellent crystallinity can be obtained.

The present invention is not limited to the above-described embodiment, but may be modified and applied in various manners. Other embodiments applicable to the present invention will be explained below.

In the above-described embodiment, the present invention has been explained by employing, as an example, the case where the multiple bosses 16 having a cylindrical shape are formed on the upper surface of the window layer 15 in a staggered state. However, the bosses 16 need only be formed in nearly uniform distribution on the upper surface of the window layer 15 and may not be formed in a staggered state.

Figure 8A:
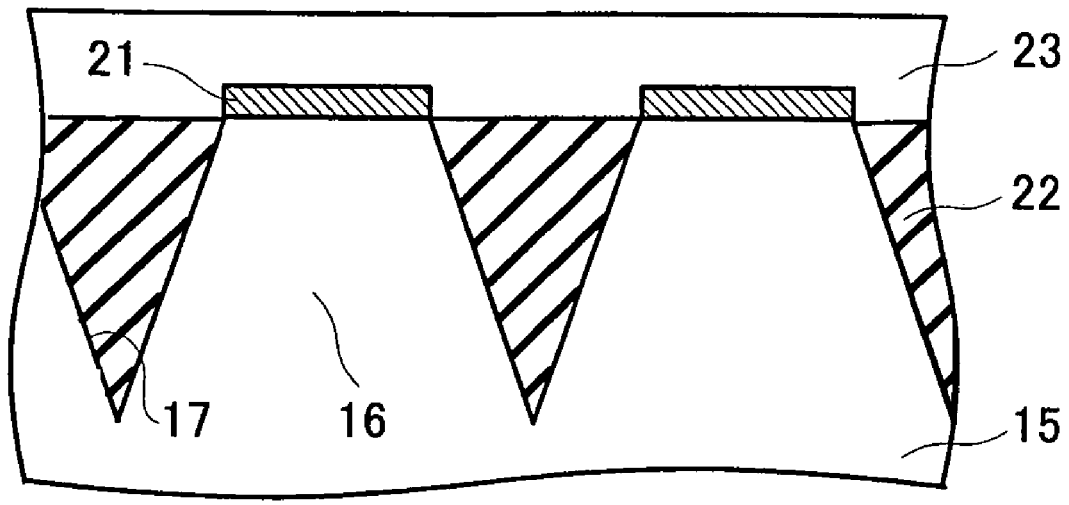
FIG. 8A and FIG. 8B are diagrams showing bosses and recesses according to other embodiments.
Figure 8B:
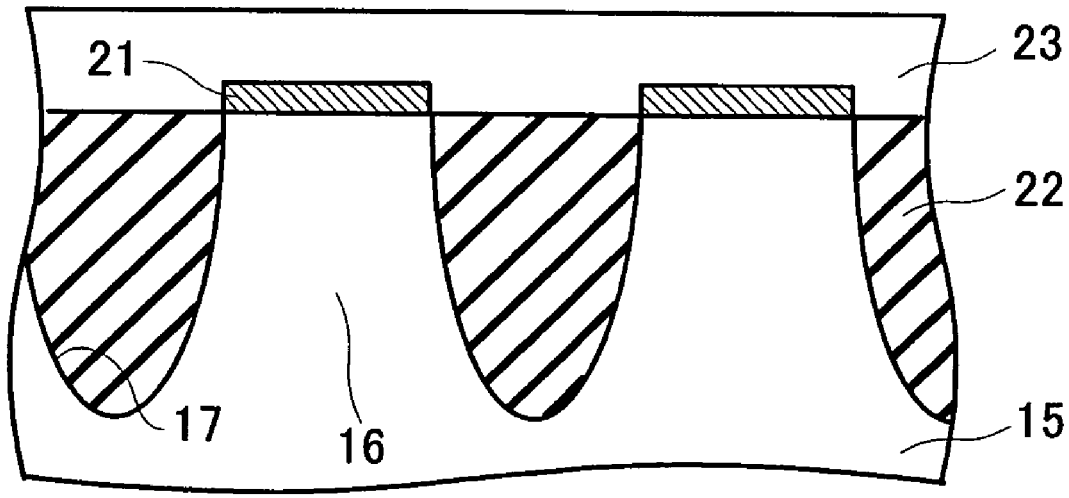

The shape of the bosses 16 is not limited to a cylindrical shape. For example, the bosses 16 may be formed in a manner that the cross-sectional shape of the recesses 17 will be a/an (inverted) triangular shape as shown in FIG. 8A. Or, the bosses 16 may be formed in a manner that the cross-sectional shape of the recesses 17 will be a semielliptic shape as shown in FIG. 8B. The plan-view shape of the recesses 17 is not limited to a circular shape, but may be an elliptic shape or a polygonal shape.

In the above-described embodiment, the present invention has been explained by employing, as an example, the case where the contact electrode 21 is formed on the bosses 16. However, it is only necessary that the window layer 15 and the transparent conductor film 23 be electrically connected to each other, and the contact electrode 21 may not necessarily be formed. Further, the window layer 15 and the transparent conductor film 23 may be electrically connected to each other via the side surface of the bosses 16 and via the recesses 17, as well as via the upper surface of the bosses 16. Furthermore, the window layer 15 and the transparent conductor film 23 may be electrically connected to each other only via the side surface of the bosses 16 and via the recesses 17. However, since it is preferred that the amount of light emission be relatively large under the bosses 16 in order to raise the light extraction efficiency, it is preferable that the window layer 15 and the transparent conductor film 23 be electrically connected to each other only via the upper surface of the bosses 16, as in the above-described embodiment.

In the semiconductor light emitting element 1 of the above-described embodiment, bosses 16 and recesses 17 may be formed on the upper surface of the transparent conductor film 23 in order to prevent the light from the transparent conductor film 23 from being total-reflected on the interface between the transparent conductor film 23 and the protection layer 25. In this case, the light extraction efficiency can be improved since the light from the transparent conductor film 23 can be excellently let out.

In the semiconductor light emitting element 1 of the above-described embodiment, a known current block layer may be formed at the location under the anode electrode 24, in order to relatively enlarge the current that is to flow into the element's outermost portion in the active layer 13. In this case, the amount of current to flow into the element's outermost portion increases, and the light emitted by the active layer 13 can be excellently let out, further contributing to improving the light extraction efficiency.

In the semiconductor light emitting element 1 of the above-described embodiment, a reflexive film may be formed, for example, between the N-type substrate 11 and the N-type auxiliary layer 12. By forming a reflexive film using a reflexive material having a high conductivity, such as aluminum or the like, it is possible to increase the efficiency of utilization of the emitted light, by reflecting the light emitted from the active layer 13 toward the side of the N-type substrate 11 to go back to the window layer 15.

In the above-described embodiment, the present invention has been explained by employing, as an example, the case where the window layer 15 is formed of a single-layered semiconductor layer. However, the window layer 15 may have, for example, a multilayered structure in which an AlGaAs semiconductor layer and an AlGaInP semiconductor layer are stacked. Further, the transparent dielectric film 22, the transparent conductor film 23, the protection layer 25, and the like may be formed of a stacked layer including multiple layers. In this case, it is preferred that a material having a refraction index at which the critical angle at the interface of each of these films will be as large as possible be used for each film.

In the above-described embodiment, the present invention has been explained by employing, as an example, the case where the surface and the like of the transparent conductor film 23 and anode electrode 24 are covered with the protection layer 25 made of epoxy resin or the like. However, the protection layer 25 may not be formed. In this case, it is preferred that a material having a favorable refraction index based on the refraction index of the ambience be used for the transparent conductor film 23.

In the semiconductor light emitting element 1 of the present invention, it is preferred that the refraction index n1 of the transparent conductor film 23, the refraction index n2 of the transparent dielectric film 22, the refraction index n3 of the window layer 15, and the refraction index n4 of the protection layer 25 satisfy the relationship of $n4<n1 \leq n2<n3$. However, the relationship of $n4<n2<n1<n3$ or the relationship of $n4<n1<n3<n2$ may be possible.

In the above-described embodiment, the present invention has been explained by employing, as an example, the case where the anode electrode 24 is formed of an Au electrode or the like. However, the anode electrode 24 may be formed of a conductor film made of ITO or the like, likewise the transparent conductor film 23.

In the above-described embodiment, the present invention has been explained by employing, as an example, the case where the semiconductor base 10 comprises the N-type substrate 11 and the N-type auxiliary layer 12. However, the conductivity type of these members may be reversed.

In the above-described embodiment, the present invention has been explained by employing, as an example, the case where a light emitting diode is used as the semiconductor light emitting element 1. However, the present invention is not limited to a light emitting diode, but may be applicable to any semiconductor device of an electroluminescence type such as a semiconductor laser, etc.

According to the present invention, it is possible to improve the light extraction efficiency. Further, it is possible to excellently suppress reflection of the emitted light on the surface of the element.

Various embodiments and changes may be made thereunto without departing from the broad spirit and scope of the invention. The above-described embodiment intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2004-284924 filed on Sep. 29, 2004 and including specification, claims, drawings and summary. The disclosure of the above Japanese Patent Application is incorporated herein by reference in its entirety.

What is claimed is:

1. A semiconductor light emitting element, comprising:
   a first semiconductor layer of first conductivity type;
   an active layer formed on said first semiconductor layer;
   a semiconductor layer of second conductivity type having a one surface which is formed on said active layer and whose one surface comprises an optical window from which a light is extracted, and having a plurality of recesses formed to define a plurality of bosses;
   a dielectric film formed of a dielectric material having light transmissivity in said recesses to fill up said recesses and to allow the light to be extracted therefrom; and
   a conductor film formed on said recesses and bosses and having light transmissivity and formed on said one surface of said semiconductor layer and
   an electrode formed on a region of said conductor film opposing to said optical window,
   wherein said dielectric film formed in said recesses does not have low-resistive contact with said conductor film, and said conductor film and said semiconductor layer of second conductivity type are electrically connected via said bosses to each other.

2. The semiconductor light emitting element according to claim 1, wherein a current flows via said bosses, but does not flow via said dielectric film formed in said recesses.

3. The semiconductor light emitting element according to claim 1, further comprising a conductive film having a light transmissivity, which is formed on said bosses but not formed on said recesses,
   wherein said conductor film and said bosses are electrically connected to each other via said conductive film.

4. The semiconductor light emitting element according to claim 1, wherein a refraction index n1 of said conductor film, a refraction index n2 of said dielectric film, and a refraction index n3 of said semiconductor layer of second conductivity type satisfy a relationship of $n1 \leq n2 \leq n3$.

5. The semiconductor light emitting element according to claim 1, wherein a width X of said bosses and a height Y of said bosses satisfy a relationship of $(Y/3) \leq X \leq 3Y$.

6. The semiconductor light emitting element according to claim 1, wherein:
   a wavelength λ of a light emitted in said semiconductor layer of second conductivity type and a width X of said bosses satisfy a relationship of $X \geq (\lambda/2)$; and the wavelength $\lambda$ of the light emitted in said semiconductor layer of second conductivity type and a height Y of said bosses satisfy a relationship of $$Y \geq (\lambda/2).$$

7. The semiconductor light emitting element according to claim 1, further comprising a protection film which is formed on said conductor film.

8. The semiconductor light emitting element according to claim 7, wherein a refraction index n1 of said conductor film, a refraction index n2 of said dielectric film, a refraction index n3 of said semiconductor layer and a refraction index n4 of said protection film satisfy relationships of $$n4 < n1 \leq n2 < n3.$$

9. The semiconductor light emitting element according to claim 1, wherein said electrode is formed in a center region of said optical window.

* * * * *